United States Patent
Sousa et al.

(10) Patent No.: US 12,292,486 B2
(45) Date of Patent: May 6, 2025

(54) METHOD FOR MEASURING AN EXTERNAL MAGNETIC FIELD BY AT LEAST ONE MAGNETIC MEMORY POINT

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR)

(72) Inventors: Ricardo Sousa, Grenoble (FR); Ioan-Lucian Prejbeanu, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS)

( * ) Notice: Subject to any disclaimer, the term of this patent is extended or adjusted under 35 U.S.C. 154(b) by 125 days.

(21) Appl. No.: 18/042,697

(22) PCT Filed: Aug. 24, 2021

(86) PCT No.: PCT/EP2021/073330
§ 371 (c)(1),
(2) Date: Feb. 23, 2023

(87) PCT Pub. No.: WO2022/043292
PCT Pub. Date: Mar. 3, 2022

(65) Prior Publication Data
US 2023/0358826 A1  Nov. 9, 2023

(30) Foreign Application Priority Data
Aug. 24, 2020  (FR) ...................... 2008638

(51) Int. Cl.
G01R 33/09  (2006.01)
G01D 5/14  (2006.01)
H10N 50/20  (2023.01)

(52) U.S. Cl.
CPC ............. G01R 33/093 (2013.01); G01D 5/14 (2013.01); G01R 33/098 (2013.01); H10N 50/20 (2023.02)

(58) Field of Classification Search
None
See application file for complete search history.

(56) References Cited

U.S. PATENT DOCUMENTS

2005/0073371 A1  4/2005  Brett et al.
2008/0100969 A1  5/2008  Mizuno et al.
(Continued)

FOREIGN PATENT DOCUMENTS

EP  3 528 256 A1  8/2019

OTHER PUBLICATIONS

International Search Report as issued in International Patent Application No. PCT/EP2021/073330, dated Nov. 8, 2021.
(Continued)

Primary Examiner — Jas A Sanghera
(74) Attorney, Agent, or Firm — Pillsbury Winthrop Shaw Pittman LLP

(57) ABSTRACT

A method for measuring the intensity of an external magnetic field by using a magnetic memory point including a storage layer having a magnetisation switchable between two magnetisation directions substantially perpendicular to the plane of the layer; a reference layer having a fixed magnetisation perpendicular to the plane of the layer; and a tunnel barrier layer separating the storage layer and the reference layer; the method including successively applying a plurality of currents or voltages of different amplitudes to
(Continued)

the memory point until switching of the magnetisation direction of the storage layer takes place to determine a minimum switching current value of the magnetisation direction of the storage layer or a minimum switching voltage value of the magnetisation direction of the storage layer, and determining the intensity of the external magnetic field to be measured from the minimum switching current value or the minimum switching voltage value.

15 Claims, 6 Drawing Sheets

(56) References Cited

U.S. PATENT DOCUMENTS

| 2009/0015972 | A1 | 1/2009 | Dieny et al. |
| 2011/0169488 | A1 | 7/2011 | Mather |
| 2015/0213868 | A1 | 7/2015 | Wu et al. |
| 2016/0322937 | A1* | 11/2016 | Suzuki .................. H01F 10/324 |
| 2018/0358543 | A1 | 12/2018 | Le et al. |

OTHER PUBLICATIONS

Parkin, S. S. P., "Systematic Variation of the Strength and Oscillation Period of Indirect Magnetic Exchange Coupling through the 3d, 4d, and 5d Transition Metals," Physical Review Letters, vol. 67, No. 25, Dec. 1991, pp. 3598-3601.

* cited by examiner

--Prior Art--

METHOD FOR MEASURING AN EXTERNAL MAGNETIC FIELD BY AT LEAST ONE MAGNETIC MEMORY POINT

CROSS-REFERENCE TO RELATED APPLICATIONS

This application is the U.S. National Stage of PCT/EP2021/073330, filed Aug. 24, 2021, which in turn claims priority to French patent application number 2008638, filed Aug. 24, 2020. The content of these applications are incorporated herein by reference in their entireties.

TECHNICAL FIELD OF THE INVENTION

The technical field of the invention is that of spintronics and more particularly of magnetic sensors and memories operating by means of the tunnel magnetoresistance principle.

The present invention relates to a method for obtaining a linear magnetic field sensor functionality based on the use of at least one magnetic random access memory element such as, for example, an MRAM (Magnetic Random-Access Memory) type memory. As an example of this MRAM type memory, a tunnel junction with perpendicular magnetic anisotropy can be mentioned.

TECHNOLOGICAL BACKGROUND OF THE INVENTION

MRAM devices with perpendicular anisotropy with a write mechanism based on spin transfer torque comprise, in their simplest form, three elements. One such MRAM device is represented in [FIG. 1A].

The MRAM device 1 represented in [FIG. 1A] comprises a magnetic tunnel junction 10, the magnetic tunnel junction 10 comprising a reference layer 107 of fixed magnetisation direction 106, a so-called "free" or "storage" layer 101 of magnetisation direction 102 which is variable between two states and a tunnel barrier layer 105 separating the two layers 101 and 107, forming a magnetic tunnel junction.

In one favoured embodiment of this MRAM, the magnetic layers 101 and 107 have perpendicular magnetic anisotropy, such that the favoured magnetisation direction is orthogonal to the substrate surface. The most common operating principle of such an MRAM device 1 is to have the reference layer 107 with a much higher magnetic anisotropy with respect to that of the storage layer 101, such that the magnetic field required to reverse the magnetisation direction of the storage layer 101 is much lower than that of the reference layer 107. The magnetisation 106 of the reference layer 107 can be considered fixed, pointing for example upwards in [FIG. 1A], while the magnetisation 102 of the storage layer 101 can take either of two preferred directions, either upwards or downwards, as represented in [FIG. 1A].

The resistance state of the MRAM device 1 can be measured by measuring the resistance of the magnetic tunnel junction 10. The resistance measured as a function of the magnetic field, varies between a minimum resistance when the magnetisations 106 and 102 point in the same direction and a state of maximum resistance for opposite directions.

A favoured method to shift from one resistance state to the other is to apply a current through such a magnetic tunnel junction 10. At a threshold value of current flow, the magnetic moment transferred by the spin-biased current is sufficiently large to reverse the magnetisation direction 102 of the storage layer 101. The threshold current density jc can be estimated as follows:

$$j_c = \frac{2e}{\hbar}\frac{\alpha}{\eta}\mu_0 M_s t(H_k + H_{eff})$$

Where e is the electron charge, η is the spin bias, $\mu_0$ is the vacuum permeability, h-bar is the reduced Planck constant, Ms is the saturation magnetisation, t is the thickness of the storage layer 101 and Hk is the magnetic anisotropy of the storage layer 101. The magnetic field Heff acting on the storage layer 101 results from the sum of the external field and the dipole field created by the reference layer 107. Thus, for the operation of the memory, the magnetic tunnel junction 10 of the MRAM device 1 will generally have a reference layer 107 designed to reduce this dipole field. For example, this may be performed by dividing the reference layer 107 into two magnetic sub-layers having opposite magnetisation directions as represented in [FIG. 1B].

In [FIG. 1B], the MRAM device 1b comprises a magnetic tunnel junction 10b comprising a storage layer 101 having a magnetisation direction 102, a tunnel barrier layer 105 and a reference layer 107b. The reference layer 107b comprises three sub-layers: a magnetic sub-layer 107 having a fixed magnetisation direction 106 such as that of the MRAM device 10 of [FIG. 1], a magnetic sub-layer 109 having a magnetisation direction 110, and an antiferromagnetic coupling sub-layer 108 for coupling the magnetic sub-layers 107 and 109 to each other according to an RKKY ("Ruderman-Kittel-Kasuya-Yosida") coupling. The RKKY ("Ruderman-Kittel-Kasuya-Yosida") coupling is an interaction between the magnetic moments of two magnetic layers separated by a non-magnetic layer. This antiferromagnetic RKKY coupling is ensured by the presence of a non-magnetic spacer layer between the two coupled magnetic layers. By modifying the thickness of the non-magnetic spacer layer, the RKKY coupling between the two magnetic layers oscillates and shifts from ferromagnetic to antiferromagnetic. This phenomenon is described in: Parkin et al, Phys. Rev. Lett. Vol 67 p 3598, 1991. By introducing an antiferromagnetic coupling layer 108 (for example of Ru, Ir, Ta or Mo) between the two magnetic sub-layers 107 and 109 such that the two sub-layers have opposite magnetisation directions, a synthetic antiferromagnetic structure ("SAF") is created. Such a magnetic tunnel junction 10b has a lower dipole field than the dipole field of the magnetic tunnel junction 10 in [FIG. 1A].

The MRAM devices 1 and 1b described above will store information in the magnetisation direction 102, which can be read through the resistance state of the magnetic tunnel junction 10 and 10b respectively. Switching from one state to the other can be performed by applying a field or current above threshold values. The characteristics of the transfer curve are those of a hysteresis curve, where in some field or current range, high and low resistance states are possible, and above the field or current switching thresholds, only one resistance state becomes possible. By "a single resistance state", it is meant a high, intermediate or low state, each resistance state not being defined by a single resistance value but by a set of resistance values, for example by a resistance interval.

On the other hand, magnetic field sensors having linear characteristics are based on magnetic configurations in which the magnetisation of the reference layer 107b and that of the detection layer 101 are orthogonal to each other. This is illustrated in [FIG. 2], where the detection layer 101 may have a magnetisation direction 102 that is orthogonal to the magnetisation direction of the reference layer 107b in the absence of a field (white arrow). The magnetic field sensor 1c represented in [FIG. 2] may comprise only a reference sub-layer 107 instead of a SAF (Synthetic Anti-Ferromagnet corresponding to a multilayer reference layer 107b).

For a field applied in the vertical direction, that is, perpendicular to the plane of the layers, the magnetisation can rotate between a parallel alignment and antiparallel alignment with the reference layer 107b. Starting from the direction orthogonal to equilibrium, the electrical conductance of the magnetic tunnel junction 10c of the magnetic field sensor 1c varies as cos(θ), where θ is the relative angle between the magnetisation directions of the reference layer 107b and of the detection layer 101. For a field applied along the magnetisation axis of the reference layer 107b, the resistance changes almost linearly with the field applied. Techniques can be used to further linearise the output of the field sensor 1c, for example by combining several sensors 1c having opposite reference layer 107b directions in a full Wheatstone bridge or half Wheatstone bridge arrangement. However, each sensor always has orthogonal magnetisation directions between the detection 101 and reference 107 or 107b layers when no magnetic field is applied, unlike a memory for which the magnetisation direction of the detection 101 and reference 107 or 107b layers has to be aligned along the same axis.

Because the alignment requirements of the magnetisation with zero external field for the memory and sensor operations are so different, the purpose of creating a sensor and a memory from the same stack of materials requires a compromise between the two functionalities. The result is a degraded co-integration of both types of devices in the same substrate, based on the same magnetic stack.

SUMMARY OF THE INVENTION

The invention provides a solution to the problems previously discussed, by allowing the functionality of a storage memory point with perpendicular interface anisotropy to be extended beyond its information storage function, to also obtain a linear magnetic field sensor function using the same magnetisation that optimizes memory operation.

One aspect of the invention thus relates to a method for measuring the intensity of an external magnetic field by using at least one magnetic memory point comprising:
  a storage layer having a magnetisation switchable between two magnetisation directions substantially perpendicular to the plane of the layer;
  a reference layer having a fixed magnetisation perpendicular to the plane of the layer; and
  a tunnel barrier layer separating the storage layer and the reference layer;
  the method being characterised in that it comprises at least:
  a step of successively applying a plurality of currents or voltages of different amplitudes to said at least one memory point until switching of the magnetisation direction of the storage layer takes place to determine a minimum switching current value of the magnetisation direction of the storage layer or a minimum switching voltage value of the magnetisation direction of the storage layer, switching of the magnetisation direction of the storage layer being switching of the magnetisation direction of the storage layer from a configuration parallel to the magnetisation direction of the reference layer to a configuration antiparallel to the magnetisation direction of the reference layer or switching from a configuration antiparallel to the magnetisation direction of the reference layer to a configuration parallel to the magnetisation direction of the reference layer as a function of an initial magnetisation direction of the storage layer,
  a step of determining the intensity of the external magnetic field to be measured from the value of the minimum switching current or the value of the minimum switching voltage.

By "switching", it is meant switching of the magnetisation direction of the storage layer from a configuration parallel to the magnetisation direction of the reference layer to a configuration antiparallel to the magnetisation direction of the reference layer or switching from a configuration antiparallel to the magnetisation direction of the reference layer to a configuration parallel to the magnetisation direction of the reference layer as a function of the initial magnetisation direction.

Since the magnetisation direction of the reference and storage layers is orthogonal to the plane of the layers, by the "external magnetic field intensity", it is meant the intensity of the vertical component of the external magnetic field, that is, the intensity of the component along the axis of the magnetisation direction of the reference and storage layers.

By "minimum switching current or minimum switching voltage", it is meant the smallest current or voltage applied to the magnetic tunnel junction after the application of which the magnetisation direction of the storage layer has been switched.

By means of the invention, the intensity of the perpendicular component of the external magnetic field can be obtained from the minimum switching voltage or the minimum switching current of the magnetic memory point, the minimum switching voltage or the minimum switching current being obtained by successively applying currents or voltages of different amplitudes. By "successively applying a plurality of currents or voltages", it is meant applying currents or voltages following each other, whether this application is discrete or continuous. Thus, for example, applying voltage or current pulses and applying a voltage or current ramp are included in a successive application of a plurality of currents or voltages. The invention indeed makes advantageous use of the fact that the current and voltage vary essentially linearly with respect to the external magnetic field applied, allowing for a voltage difference that is essentially linearly proportional to the intensity of the external magnetic field.

Since magnetic memories of the state of the art already have read and write means, the present invention makes it possible to advantageously reuse these means to achieve the functionality of magnetic field intensity sensing.

By means of the invention, the properties of the sensor, such as sensitivity and field range, can be adjusted solely by modifying the area of the sensor (along the plane of the layers), without the need to modify the stack of materials.

The invention thus makes it possible, with the same magnetic stack, to have the two functionalities of information storage and magnetic field sensing without compromising on the realisation of the storage and sensing functionalities and with a small overall size.

Advantageously, the invention makes it possible to meet the various specification requirements of the sensors by simply adjusting the lateral dimensions of the memory point.

In addition to the characteristics just discussed in the preceding paragraph, the method for measuring the intensity of an external magnetic field according to one aspect of the invention may have one or more complementary characteristics from among the following, considered individually or according to all technically possible combinations:

said at least one memory point is a magnetic tunnel junction with out-of-plane magnetisation.

the step of determining the intensity of the external magnetic field further comprises at least the substeps of:
   calculating the difference between the minimum switching current value or the minimum switching voltage value and at least one reference switching current value or reference switching voltage value measured according to the same method under a reference external magnetic field and
   calculating a magnetic field intensity value comprising multiplying the difference between the minimum switching current value or the minimum switching voltage value and the at least one reference switching current value or reference switching voltage value by a proportionality constant and adding the resulting value to the intensity value of the reference field.

the proportionality constant is determined by calculating a ratio of the difference between a calibration switching current value or calibration switching voltage value and a reference switching current value or reference switching voltage value to the difference between an intensity value of a calibration magnetic field and an intensity value of the reference magnetic field. This makes it possible, in particular, to advantageously use the linearity of the ratio of current or voltage to intensity of the magnetic field applied to determine the value of the present external magnetic field applied.

the step of successively applying a plurality of currents or voltages of different amplitudes until switching of the magnetisation direction of the storage layer takes place comprises the substeps of:
   determining a first resistance of said at least one magnetic memory point, determining the first resistance comprising measuring a current or voltage across the magnetic memory point,
   comparing the first resistance obtained to a reference resistance value to identify a relative initial magnetisation direction of the storage layer with respect to the reference layer,
   applying to said at least one magnetic memory point a current or voltage pulse of a predefined amplitude and polarity promoting switching of the storage layer to an opposite direction to the relative initial magnetisation direction of the storage layer with respect to the reference layer,
   determining a second resistance of said at least one magnetic memory point, determining the second resistance comprising measuring a current or voltage across the magnetic memory point after applying a current or voltage pulse to the magnetic memory point,
   comparing the second resistance obtained to the reference resistance value to determine whether switching of the magnetisation direction of the storage layer has taken place,
   If switching of the magnetisation direction of the storage layer has taken place:
      the minimum switching current or minimum switching voltage is the current or voltage applied in the previous step of applying a current or voltage pulse to the magnetic memory point,
   If switching of the magnetisation direction of the storage layer has not taken place, the substeps of applying a current or voltage pulse to the magnetic memory point, determining a second resistance and comparing the second resistance to the first resistance are repeated with a current or voltage pulse of a modified amplitude different from the predefined amplitude until switching of the magnetisation direction of the storage layer takes place.

the predefined amplitude is a low amplitude and the modified amplitude is greater than the low amplitude. This makes it possible to have a lower power consumption than when starting for example with currents or voltages of high amplitude and then selecting lower amplitudes, the switching threshold being in this case determined by the first amplitude without switching of the magnetisation.

the step of successively applying a plurality of currents or voltages of different amplitudes until switching of the magnetisation direction of the storage layer takes place comprises the substeps of:
   Applying a current or voltage ramp or periodic signal, of a polarity promoting switching of the storage layer to an opposite direction to the relative initial magnetisation direction of the storage layer with respect to the reference layer, until switching of the magnetisation direction of the storage layer is detected,
   determining the amplitude of the minimum switching current or minimum switching voltage as a function of the total application time of the current or voltage ramp to obtain the value of the minimum switching current or minimum switching voltage.

the method for measuring the intensity of an external magnetic field comprises an additional step of applying a pulse after detecting switching of the magnetisation direction of the storage layer, the pulse having a polarity promoting switching of the storage layer to the relative initial magnetisation direction of the storage layer with respect to the reference layer and having an amplitude greater than the amplitude of the minimum switching current or the minimum switching voltage.

the method for measuring the intensity of an external magnetic field uses a plurality of magnetic memory points, and the step of successively applying a plurality of currents or voltages of different amplitudes is performed in parallel for the magnetic memory points of the plurality of magnetic memory points.

the step of successively applying a plurality of currents or voltages of different amplitudes in parallel is performed simultaneously for each magnetic memory point of the plurality of magnetic memory points, and the minimum switching current value or the minimum switching voltage value of the magnetisation direction is the minimum switching current value or the minimum switching voltage value of the magnetisation direction of the storage layer of each magnetic memory point of the plurality of magnetic memory points. This especially allows the memory to be reset to its initial, that is, pre-measurement, state if necessary.

Another aspect of the invention relates to a magnetic memory point characterised in that it is configured to implement the method for measuring an external magnetic field according to the invention, and in that it further comprises a controller configured to manage the measurement of the resistance of the magnetic memory point.

In addition to the characteristics just discussed in the preceding paragraph, the method for measuring the intensity of an external magnetic field according to one aspect of the invention may have one or more complementary characteristics from among the following, considered individually or according to all technically possible combinations:

- the magnetic memory point includes a magnetic tunnel junction with out-of-plane magnetisation (or perpendicular anisotropy)
- the magnetic memory point further comprises a pulse generator and the controller is further configured to manage the pulse generator,
- the magnetic memory point has lateral dimensions of less than 200 nm.

Another aspect of the invention relates to a method for determining the relative distance between a magnetic memory point according to one aspect of the invention and a magnetic object generating a magnetic field between 1 mT and 500 mT, the method being characterised in that it comprises the steps of:

Measuring the perpendicular component of a magnetic field according to the method for measuring an external magnetic field according to the invention at a plurality of points in space to determine an amplitude and a direction of the magnetic field, Calculating the relative distance between the storage layer of the magnetic memory point and the magnetic object from simulations of the magnetic field generated by the magnetic object.

The invention and its various applications will be better understood upon reading the following description and examining the accompanying figures.

BRIEF DESCRIPTION OF THE FIGURES

The figures are set forth as an indication and in no way as a limitation of the invention.

DETAILED DESCRIPTION

The figures are set forth as an indication and in no way as a limitation of the invention.

Unless otherwise specified, a same element appearing in different figures has a unique reference.

Figure 1A:
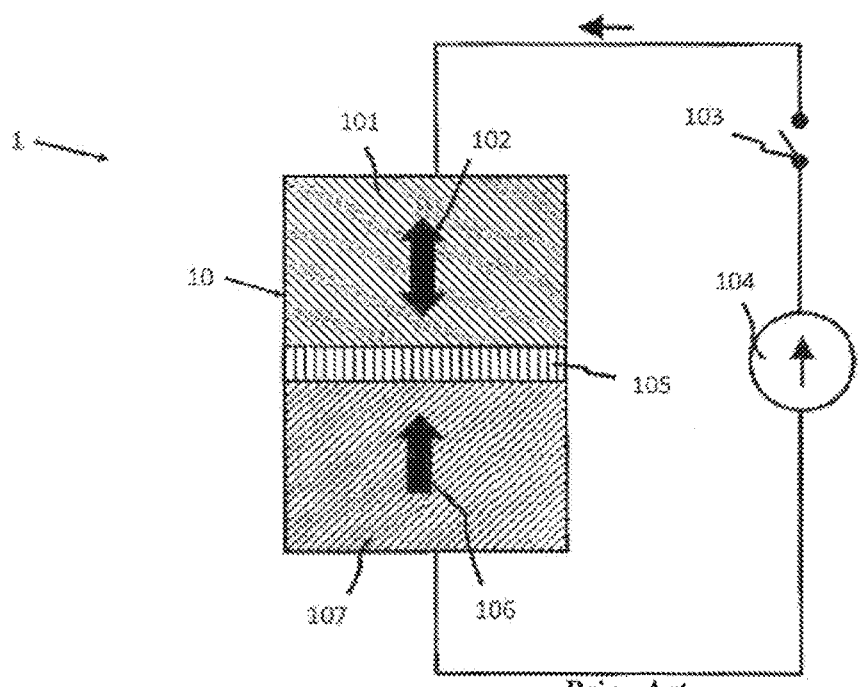
FIGS. 1a and 1b show a schematic representation of MRAM devices according to prior art.
Figure 1B:
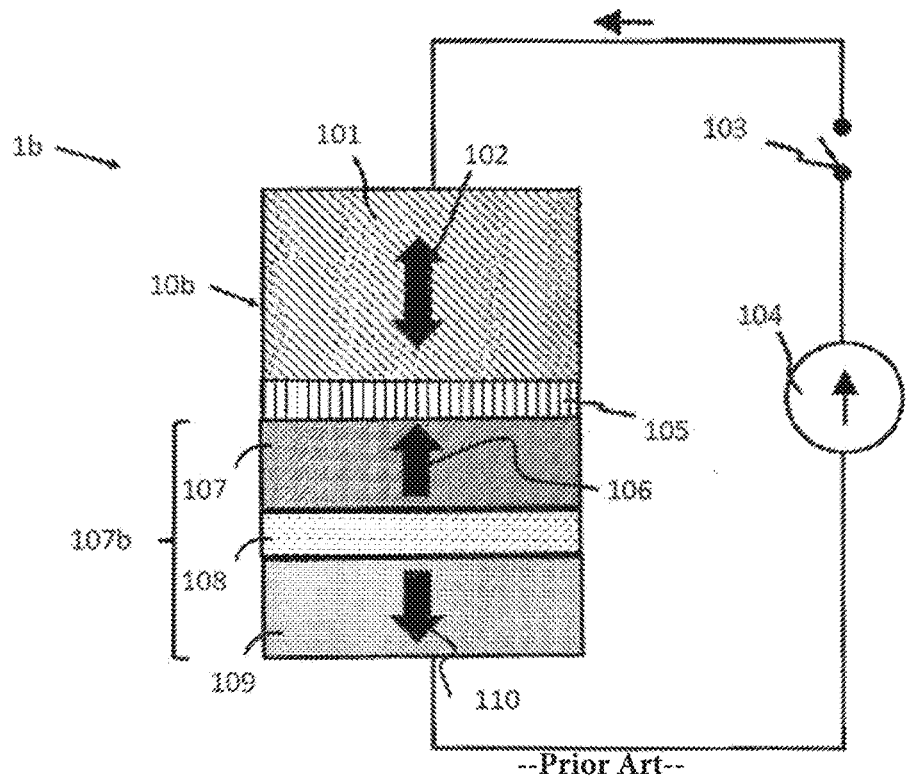
Figure 2:
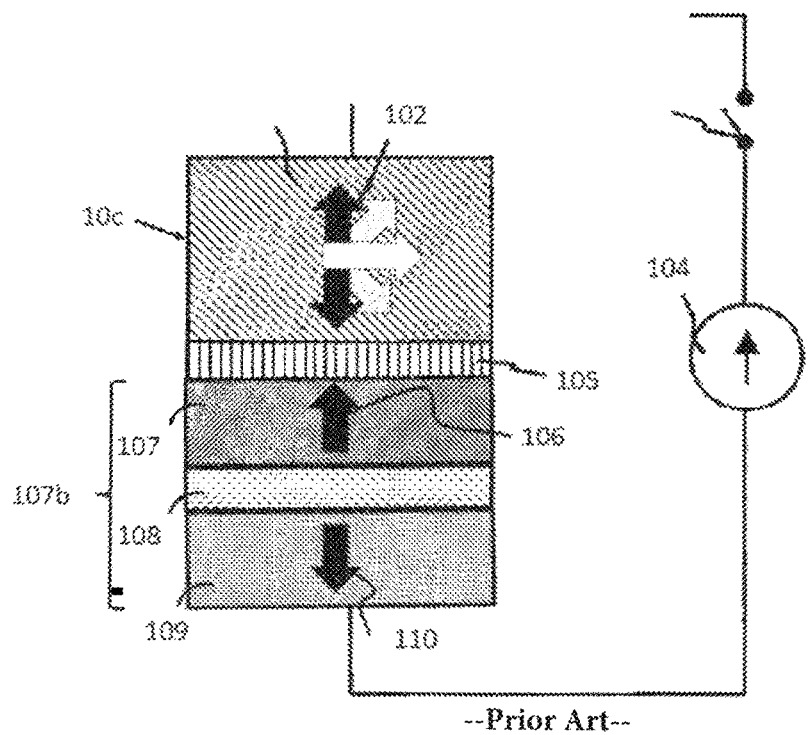
FIG. 2 shows a schematic representation of a TMR magnetic field sensor according to prior art.
Figure 3:
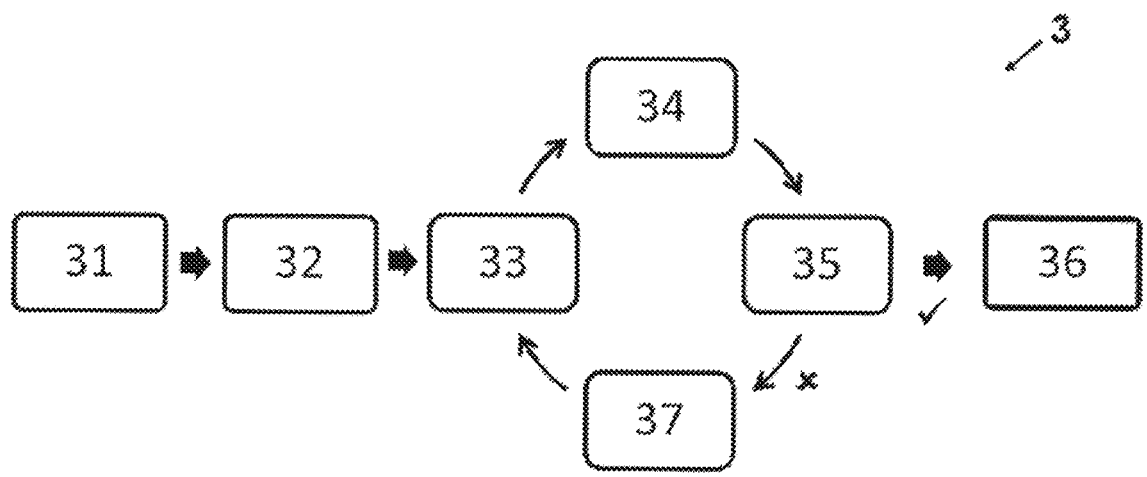
FIG. 3 shows a schematic representation of a method for measuring the intensity of a magnetic field according to an embodiment of the invention.

FIG. 3 shows a schematic representation of a method for measuring the intensity of a magnetic field according to a first embodiment of the invention.

The method 3 for measuring the intensity of an external magnetic field according to the invention is performed by using at least one magnetic memory point comprising a magnetic tunnel junction with out-of-plane magnetisation. The references of the figures representing MRAM devices of prior art will be repeated hereafter. The magnetic tunnel junction of the MRAM device used to implement method 3 comprises at least:

- a storage layer 101 having a magnetisation 102 switchable between two magnetisation directions substantially perpendicular to the plane of the layer;
- a reference layer 107 having a fixed magnetisation 106 perpendicular to the plane of the layer; and
- a tunnel barrier layer 105 separating the storage layer 101 and the reference layer 107.

By "substantially perpendicular", it is meant a direction deviated by plus or minus 15 degrees from the direction normal to the plane of the layers.

In a preferred embodiment the magnetic tunnel junction of the MRAM device used to implement the method 3 comprises an SAF 107b with two magnetic layers 107 and 109 antiferromagnetically coupled by a coupling spacer layer 108 in order to have less dipole field radiated by the MRAM device and thus have less interference to perform magnetic field measurements.

In a first embodiment of the invention, the method 3 for measuring the intensity of the vertical component of a magnetic field external to the MRAM device comprises a first step 31 of determining a first resistance of the magnetic memory point. This determination can for example be conventionally performed by measuring a voltage or a current across the magnetic memory point.

The method 3 then comprises a step 32 of comparing the first resistance obtained to a reference resistance value to identify a relative initial magnetisation direction of the storage layer 101 with respect to the reference layer 107 or SAF 107b. The reference layer 107 or SAF 107b will be referred to in the same way as "reference layer 107".

This step 32 of comparing the resistance measured to at least one reference resistance enables the relative initial magnetisation direction of the storage layer 101 with respect to the reference layer 107 to be determined, that is, whether the alignment is parallel or antiparallel. A high resistance with respect to a resistance threshold is considered to be an anti-parallel alignment of the magnetisation direction between the storage layer 101 and reference layer 107. On the contrary, a low resistance with respect to a resistance threshold is considered as a parallel alignment of the magnetisation direction 102 between the storage 101 and reference 107 layers. Thus, it is possible to determine the magnetisation direction 102 of the storage layer 101 with respect to the magnetisation direction 106 of the reference layer 107.

In the method 3, measuring the first resistance is used to determine whether the magnetisation direction 102 of the storage layer 101 has been switched, that is, whether the magnetisation direction 102 of the storage layer 101 has changed to shift from an anti-parallel alignment to a parallel state or conversely from a parallel alignment to an anti-parallel state with the magnetisation direction 106 of the reference layer 107. There is no departure from the invention when the relative magnetisation direction of the storage layer 101 with respect to the reference layer 107 is determined in another way.

The method 3 comprises a step 33 of applying to the magnetic memory point a voltage or current pulse of a predefined amplitude and polarity promoting switching of the storage layer to an opposite direction to the relative initial magnetisation direction 102 of the storage layer 101 with respect to the reference layer 107. This may be performed by means conventionally used for writing the memory. By "a polarity promoting switching of the storage layer to an opposite direction", it is meant a positive or negative polarity as a function of the initial magnetisation direction 102 measured, that is, as a function of the initial resistance measured, and allowing switching of the magnetisation direction 102 of the storage layer 101. This is represented in [FIG. 5].

Figure 5:
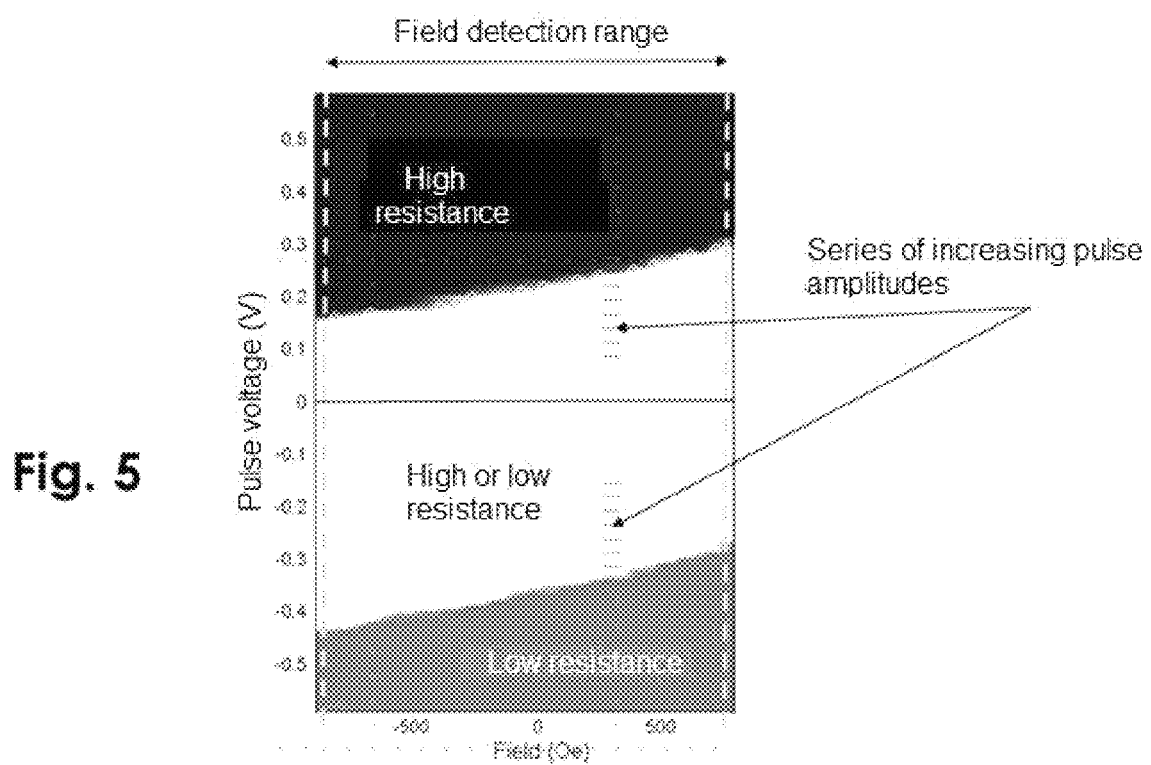
FIG. 5 shows a resistance state diagram of an MRAM device according to the invention.

FIG. 5 shows a resistance state diagram of an MRAM device. This diagram represents especially the pulse voltage in Volts versus the magnetic field in Oersted, as well as the resistance versus these two axes. Thus, by applying a pulse of positive polarity in the case represented in [FIG. 5], it will be attempted to make the alignment antiparallel, that is, to shift from a low resistance to a high resistance. On the contrary, by applying a pulse of negative polarity in the case represented in [FIG. 5], it will be attempted to make the alignment parallel, that is, to shift from a high resistance to a low resistance.

The method 3 comprises a step 34 of determining a second resistance of the magnetic memory point, determining the second resistance comprising measuring a voltage or current across the magnetic memory point after applying a voltage or current pulse to the magnetic memory point in step 33. This step may be performed in the same way as in step 31 of method 3.

In a step 35 of the method 3, the second resistance determined in step 34 is compared to the same resistance threshold used in step 32 to determine whether switching of the magnetisation direction 102 of the storage layer 101 has taken place.

If switching of the magnetisation direction 102 of the storage layer 101 has not taken place, a step 37 of modifying the amplitude of the voltage or current applied in step 33 is performed. The method is then repeated in the step 33 of applying to the magnetic memory point a voltage or current pulse of the same polarity as previously determined, but of modified amplitude as defined in step 37.

Steps 33 to 35 are repeated until switching of the magnetisation direction 102 of the storage layer 101 takes place.

Preferably, the pulses are all of the same temporal width. Indeed, variations in pulse width during the switching sequence degrade the field resolution, so the pulse width should not vary significantly throughout the pulse sequence. The pulse width can take the same values as for uses as a memory, usually greater but close to 1 ns. Larger pulse widths are also possible, but could result in a significant increase in the total time necessary to perform the measurement method 3.

If switching of the magnetisation direction 102 of the storage layer 101 has been detected in step 35, then the minimum switching current or minimum switching voltage is the current or voltage applied in the previous step 33 of applying a voltage or current pulse to the magnetic memory point.

This is represented in [FIG. 5], where successive pulses are applied to the MRAM device. A change in the magnetisation direction 102 of the storage layer 101 is detected when the pulses have sufficient amplitude and the correct polarity to switch the magnetisation direction 102 of the storage layer 101. For example, in [FIG. 5], when the external magnetic field is about 300 Oe, and the initial alignment of the magnetisation directions between the storage layer 101 and the reference layer 107 is parallel, that is, when the resistance measured is low, a minimum amplitude of about 0.23 Volts and a positive polarity are necessary to switch the magnetisation direction 102 of the storage layer 101 and thus make the alignment anti-parallel. If, on the contrary, the initial alignment of the magnetisation directions between the storage 101 and the reference 107 layer is antiparallel, that is, when the resistance measured is high, a minimum amplitude of about 0.38 Volts and a negative polarity are necessary to switch the magnetisation direction 102 of the storage layer 101 and thus make the alignment parallel.

Preferably, in order to have the lowest power consumption, it will be started at a predefined low amplitude, for example close to 0, and the amplitude will be increased with each new pulse. This enables less energy to be consumed than starting for example with high amplitude currents or voltages and then selecting lower amplitudes.

When switching of the magnetisation direction 102 of the storage layer 101 has been detected in step 35, a step 36 of determining the intensity of the external magnetic field from the value of the minimum switching current or minimum switching voltage of the magnetisation direction 102 of the storage layer 101 is performed. This determination step is enabled by means of the fact that the current and voltage vary essentially linearly with respect to the external magnetic field applied. Thus, the intensity of the vertical component of the magnetic field can be determined by calculating the difference between the value of the minimum switching voltage or minimum switching current obtained in step 35 and at least one reference switching current or reference switching voltage value measured according to the same method under a reference external magnetic field. This difference is then multiplied by a proportionality constant and added to the intensity value of the orthogonal component of the reference field. For example, the reference field may be zero. In this example, the difference between the amplitude of the minimum switching voltage or minimum switching current and the amplitude of the minimum reference voltage or minimum reference current multiplied by the proportionality constant is equal to the intensity value of the orthogonal component of the external magnetic field during the measurement.

The proportionality constant can be determined by calculating a ratio of the difference between a calibration switching voltage or calibration switching current value and a reference switching voltage or reference switching current value to the difference between an intensity value of a calibration magnetic field and an intensity value of the reference magnetic field. Thus, the proportionality constant is determined using the linear characteristic of the voltage or current variation with respect to the external magnetic field applied, by performing a slope calculation prior to any measurement. By means of this slope calculation, by taking into account two magnetic fields: a reference field and a calibration field, the proportionality constant is obtained, which then allows the minimum voltage or minimum current that has switched the magnetisation direction 102 of the storage layer 101 to be related to the external magnetic field. Thus, it is possible to determine the intensity value of the vertical component of the external magnetic field from the value of the minimum switching current or minimum switching voltage.

The accuracy of the measurement can be increased by repeatedly applying the method 3 and averaging the successive minimum switching current or minimum switching voltage values. This can be performed by successively applying the method 3 described above to determine the minimum switching current or minimum switching voltage values of the two switching directions of the storage layer: from low to high resistance and from high to low resistance. By averaging the minimum switching current or minimum switching voltage values in each direction, and then subtracting the average of each of the two minimum switching current or minimum switching voltage values under a zero external field applied, a voltage difference is obtained which is essentially linearly proportional to the amplitude of the external field. This improves the external magnetic field measurement but requires a longer time and higher power consumption.

In a second embodiment, the value of the minimum switching voltage or minimum switching current is determined by applying, instead of pulses, a voltage or current ramp, of a polarity promoting switching of the storage layer to an opposite direction to the relative initial magnetisation direction of the storage layer with respect to the reference layer, until switching of the magnetisation direction of the storage layer is detected. An alternative to this ramp may consist in using any periodic signal comprising a monotonic rising part followed by a monotonic falling part. The amplitude of the minimum switching voltage or minimum switching current is then determined as a function of the total time of application of the voltage or current ramp to obtain the value of the minimum switching voltage or minimum switching current knowing the slope of the ramp. In this second embodiment, steps 33, 34, 35 and 37 are replaced by applying a voltage or current ramp and detecting switching of the magnetisation direction 102 of the storage layer 101. The other steps 31, 32 and 36 remain unchanged and are necessary for the method 3 according to the second embodiment of the invention.

With a current ramp or a periodic signal, a continuous variation in the voltage measured is induced. When the magnetisation is reversed, this variation is very fast, for example in the order of one nanosecond, due to the change in resistance. To detect switching of the magnetisation direction, it is possible to use a high-pass filter which blocks low frequency signal variations (ramp variation) and allows high frequencies (magnetisation change) to pass.

Figure 10:
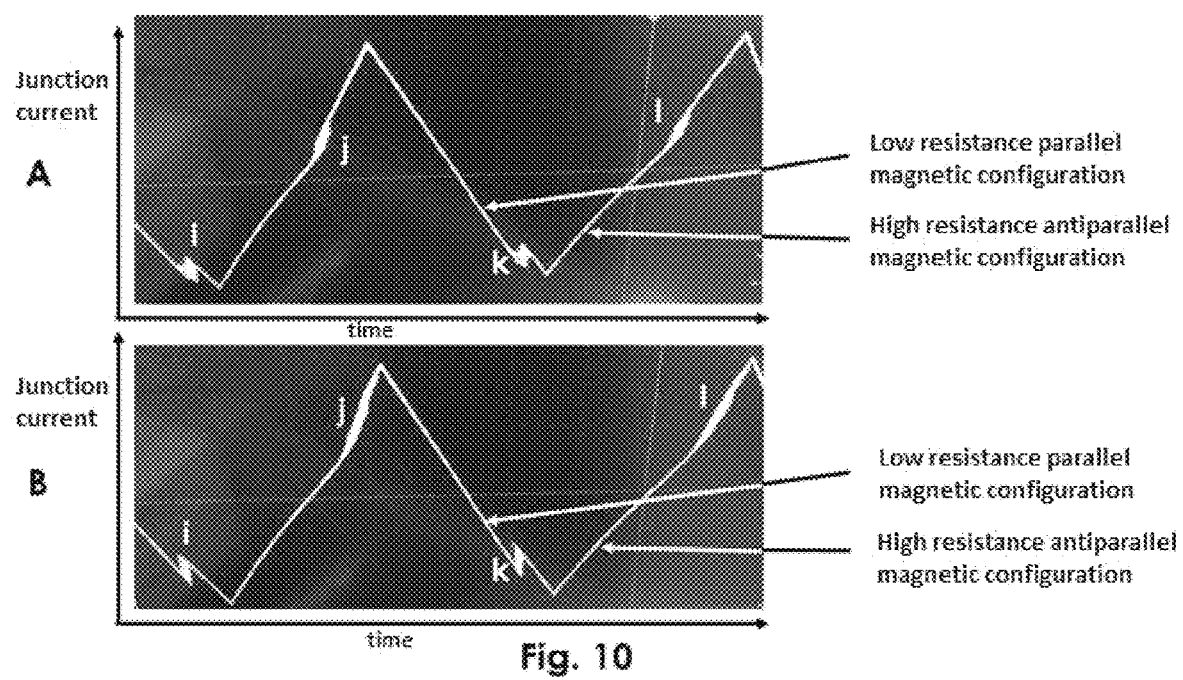
FIG. 10 shows a diagram representing the current flowing through an MRAM device according to the invention when a periodic signal is applied.

For example, [FIG. 10] shows a diagram representing the current flowing through an MRAM device when a periodic signal is applied according to the second embodiment of the invention. In FIG. 10, a triangular voltage signal is applied, comprising a monotonic rising part and a monotonic falling part. FIG. 10 shows an oscilloscope trace representing the current flowing through the MRAM device. The abscissae represent the time, for example in FIG. 10, 2 microseconds per division, and the ordinates represent the voltage, for example in FIG. 10, 20 millivolts per division. The abscissa and ordinate values are not limiting. Thus, what is represented by the abscissae is indirectly the current flowing through the MRAM device. For example, this current can be calculated as 50 Ohm times the voltage measured at the oscilloscope, in the present case where the oscilloscope is configured with an internal impedance of 50 Ohm. The exact current value depends on the resistance of the MRAM device and the voltage applied. The voltage applied to the MRAM device in FIG. 10 is a triangle wave, which can be adjusted in amplitude and offset to achieve the positive and negative voltages that trigger the junction switching. In part A of FIG. 10, the external magnetic field applied promotes a parallel configuration of the direction of the storage layer 101, while in part B the external magnetic field applied promotes an anti-parallel configuration of the direction of the storage layer 101. The switching thresholds i to I, that is, the changes in resistance states are thus increased or decreased as a function of the magnetic field applied. It is noticed that the monotonic falling part between the switching thresholds j and k is greater in part A than in part B, as the switching threshold k in part B has been moved up this slope by the presence of the magnetic field promoting an antiparallel configuration. Similarly, point j has been moved up the slope in part B, that is, it is located higher on the ordinate axis. The device changes its resistance state at each switching point i to k, at different voltage thresholds, with transition zones shown by the discontinuities in the slope. FIG. 10 thus shows that there is not a clear change in resistance state but rather transition zones at the switching thresholds.

For applying a periodic signal, another method can be implemented. If the switching voltage or current thresholds of the magnetisation of each polarity as represented for example in [FIG. 5] are symmetrical, that is, their norms are equal, the time spent in the high resistance and the time spent in the low resistance are identical and a zero DC voltage is obtained for the integration of a complete cycle. If the switching voltage or current thresholds of each polarity are asymmetrical, that is, if the absolute value of the voltage or current threshold of negative polarity is different from the absolute value of the voltage or current threshold of positive polarity, the DC value obtained for the integration of a complete cycle is non-zero and proportional to the asymmetry of the thresholds of different polarity and then allows the calculation of the external field using, for example, the resistance state diagram in [FIG. 5].

Figure 4:
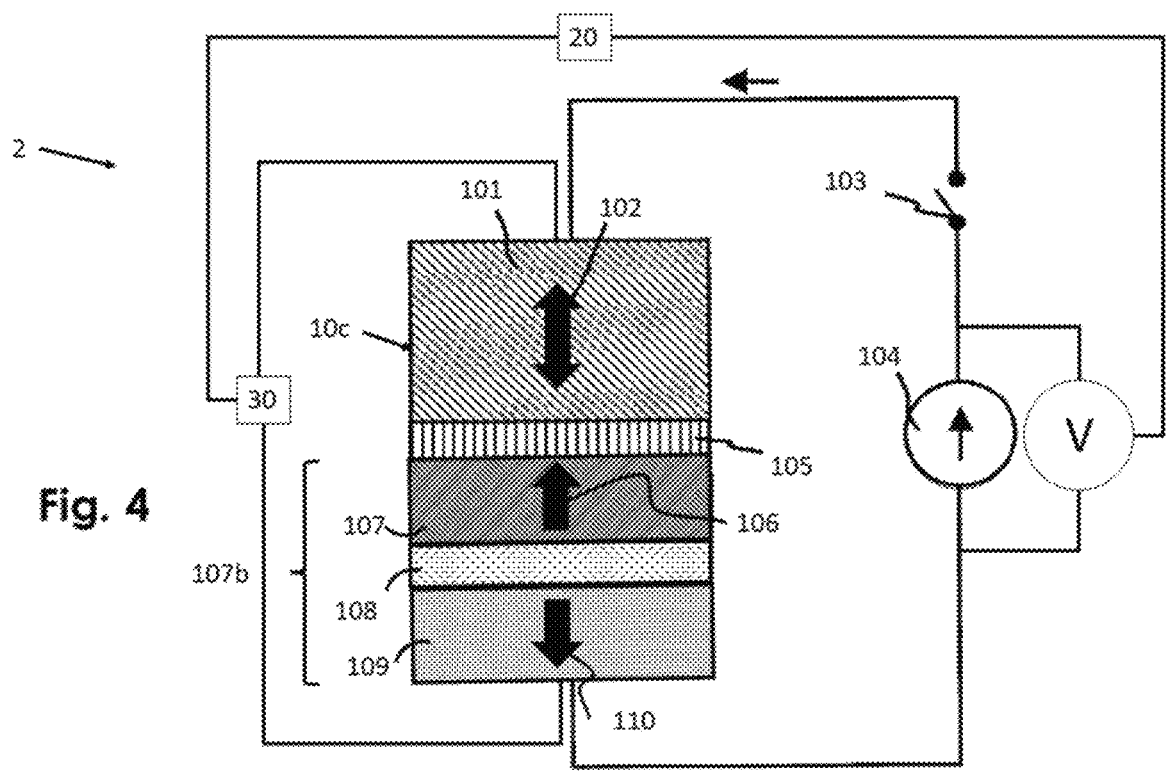
FIG. 4 shows a schematic representation of an MRAM device for implementing a method according to the invention.

The method 3 according to the first or second embodiment of the invention may further comprise an additional step of applying a pulse after detecting switching of the magnetisation direction 102 of the storage layer 101, the pulse having a polarity promoting switching of the storage layer 101 to the relative initial magnetisation direction of the storage layer 101 with respect to the reference layer 107 and having a amplitude greater than the amplitude of the minimum switching current or the minimum switching voltage, in order to restore the initial state of the magnetic memory point and not to impact its information storage functionality FIG. 4 represents an MRAM device 2 used to implement the method 3 according to the first embodiment of the invention.

The MRAM device 2 comprises a magnetic tunnel junction 10c as previously described, as well as a controller 20 and a pulse generator 30. The controller 20 is configured to manage the measurement of the resistance of the magnetic tunnel junction 10c in steps 31 and 34 of the method 3 according to the first embodiment of the invention. By "managing" the resistance measurement, it is meant all the steps necessary to obtain a resistance measurement by the controller 20, comprising for example, depending on the controller used, sending a resistance measurement request signal and receiving a resistance measurement signal, for example receiving a voltage or current value applied to the magnetic tunnel junction. The controller 20 is further configured to manage the pulse generator 30 and especially the amplitude of the voltage or current pulses and to perform at least some of the calculations comprised in the method 3, for example determining the value of the magnetic field intensity, preferably all of the calculations comprised in the method 3.

Figure 8:
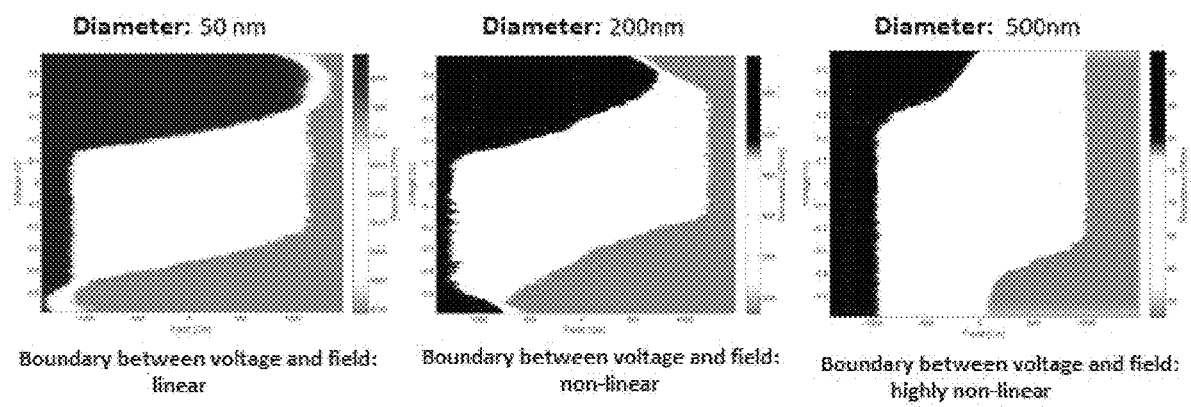
FIG. 8 shows a plurality of resistance state diagrams for different lateral dimensions of MRAM devices.

The MRAM device 2 has to have dimensions such that the sensor operation is optimised for the sensor linearity and the field range. This is made possible by having lateral dimensions of the storage layer 101 of less than 200 nm. By "lateral dimensions", it is meant for example diameter of a circle, major axis of an ellipse, length or width in the plane of the layers as a function of the geometry of the magnetic stack. For these lateral dimensions of less than 200 nm, the linearity of the switching voltage with respect to the external magnetic field is improved. Lateral dimensions larger than 200 nm show a clear deviation from the linear dependence, with a significant non-linear behaviour at 500 nm and more, as represented in [FIG. 8].

Figure 7:
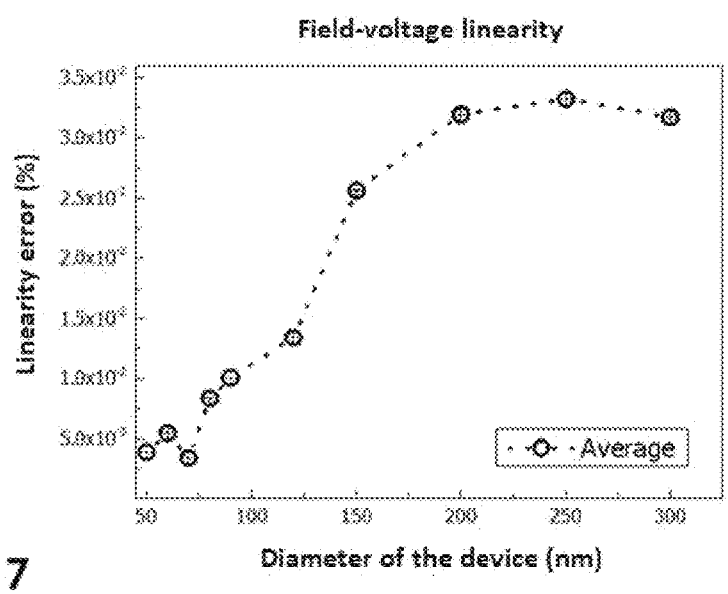
FIG. 7 shows a diagram representing the non-linearity observed as a function of the lateral dimension of the MRAM device.

Ideally, the lateral size of the detection layer should be less than 60 nm, in order to have a linearity error rate of less than $5*10^{-3}\%$, as represented in [FIG. 7].

Figure 6:
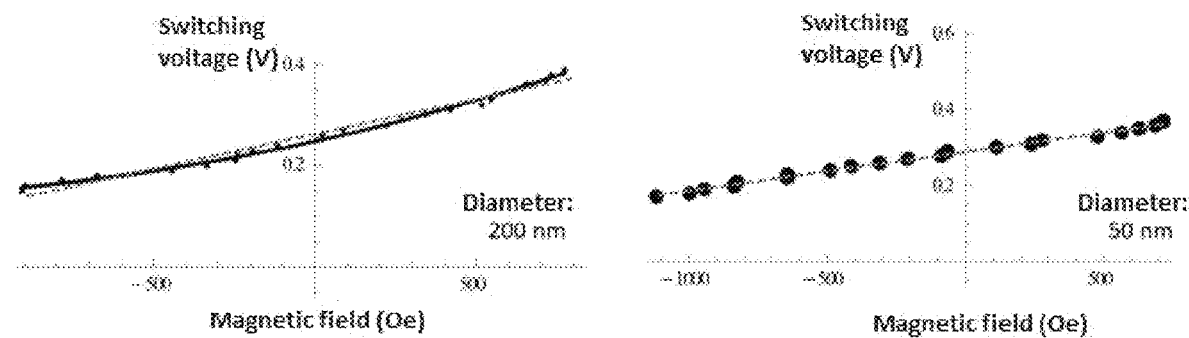
FIG. 6 shows a diagram representing the boundary between the resistance states in an MRAM device.

As a function of the lateral dimensions of the memory point, the minimum switching voltage or minimum switching current is modified. This is represented in [FIG. 6], where two diagrams represent the minimum switching voltages in Volts for two different diameters, one of 50 nm and one of 200 nm. The lower limit size is determined by the area necessary for the magnetisation 102 of the storage layer 101 to be perpendicular to the plane of the layer.

The perpendicular stability of the storage layer (or detection layer in sensor use) 102 is ensured during the measurement time $t_m$ for the condition:

$$e^\Delta > \frac{t_m}{\tau_0}$$

Where tO is the time of a switching attempt (switching pulse) generally estimated to be around 1 ns, and $\Delta$ is the thermal stability factor, corresponding to the ratio of the energy necessary to reverse the magnetisation direction to the thermal energy (kBT). The thermal stability of the memory point can be calculated from the effective anisotropy Keff, and by convention Keff has a positive value for perpendicular magnetic anisotropy. In the case of perpendicular magnetic anisotropy from the interface, Keff can be calculated from the surface anisotropy (Ks), the layer thickness (t) and the saturation magnetisation. The thermal stability factor can be estimated as follows for a magnetic element:

$$\Delta = \frac{K_{eff} V}{k_B T}, K_{eff} = \frac{K_s}{t} - 2*\pi M_s^2$$

For common values of perpendicular magnetic interface anisotropy, typical storage layers 102 are about 1 to 2 nm, adjacent to a tunnel barrier providing perpendicular interfacial anisotropy. The minimum stability requirement for the memory operation sets a typical lower limit of lateral dimension of 15 to 20 nm. In the range below 20 nm, the thermal stability of the cell is reduced, resulting in a decrease in switching voltages, a reduction in the linear range and a modification in pulse voltage and sensitivity. Thus, the lateral dimensions can be adjusted to meet different specification requirements of the sensor.

The method 3 according to the first or second embodiment can be used with several MRAM devices. When the method 3 is used with several MRAM devices, the current or voltage pulses, the current or voltage ramp or the current or voltage periodic signal are applied in parallel to the different MRAM devices. This application may be simultaneous (to several MRAM devices in parallel at the same time) or successive (to each MRAM device individually). For example, a single controller 20 may manage the application of the method 3 to all MRAM devices. In the case where the application to several MRAM devices is performed simultaneously, the amplitude of the current or the voltage is modified until switching of all MRAM devices managed is obtained.

Figure 9:
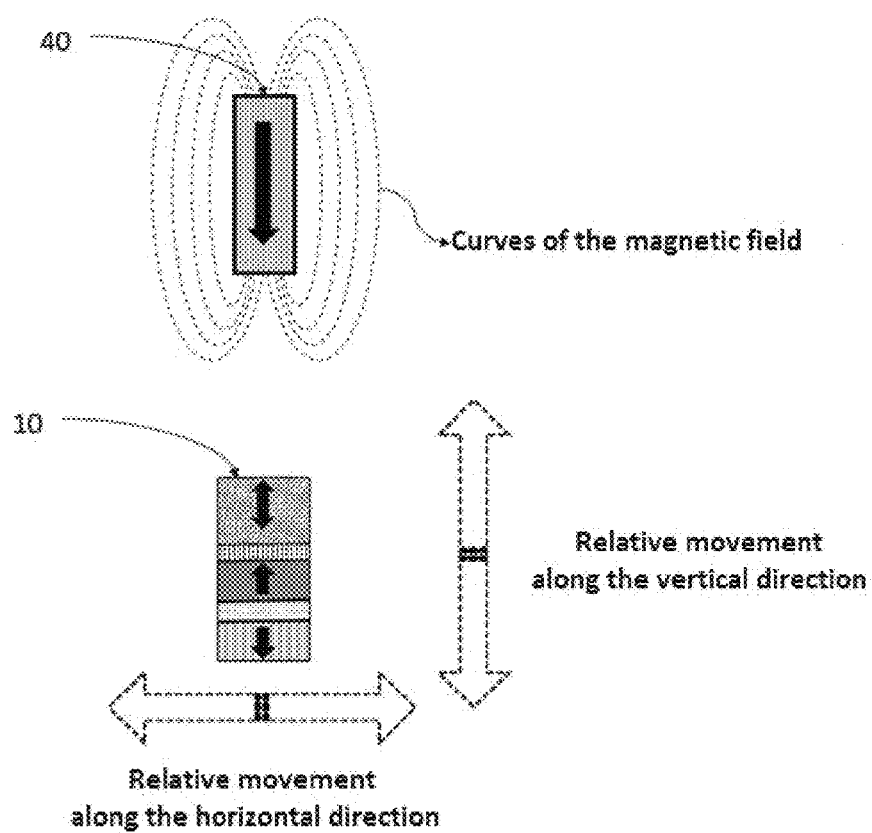
FIG. 9 shows a schematic representation of a magnetic field measurement method according to the invention.

Another object of the invention relates to the use of the method 3 for measuring the intensity of the magnetic field by at least one memory point to determine the relative distance between the memory point and a magnetic object producing a magnetic field of 1 mT to 500 mT. This is represented in [FIG. 9], where a magnetic object 40 is placed at a certain distance from the magnetic memory point 10. The magnetic memory point 10 implementing the method 3 is able to measure the external magnetic field generated by the magnetic object 40.

With an approximate knowledge of the geometry of the magnetic object 40, it is possible to determine the relative vertical and horizontal distance between the object 40 and the storage layer 102 of the memory point 10. To do so, it is necessary to determine the perpendicular component of the magnetic field generated by the magnetic object 40 by a relative scanning movement of the storage layer 102. The method 3 for measuring the intensity of the magnetic field is applied at several points in space, ideally at all points in space, to determine the amplitude and direction of the magnetic field generated by the magnetic object 40. The values measured can be used to calculate the relative distance between the memory point 10 and the magnetic object based on simulations of the magnetic field generated by the magnetic object 40. Detection may be carried out with one or more memory points 10, arranged in different relative orientations so as to have a detection with respect to the various components of the magnetic field generated by the object 40. The multiple memory points may be arranged as probes to increase the detection accuracy by interpolation or by adapting to an expected physical behaviour of the system.

The invention claimed is:

1. A method for measuring an intensity of an external magnetic field by using at least one magnetic memory point comprising:
   a storage layer having a magnetisation switchable between two magnetisation directions substantially perpendicular to the plane of the layer;
   a reference layer having a fixed magnetisation perpendicular to the plane of the layer; and
   a tunnel barrier layer separating the storage layer and the reference layer;
   the method comprising:
   a step of successively applying a plurality of currents or voltages of different amplitudes to said at least one memory point until switching of the magnetisation direction of the storage layer takes place to determine a minimum switching current value of the magnetisation direction of the storage layer or a minimum switching voltage value of the magnetisation direction of the storage layer, switching of the magnetisation direction of the storage layer being switching of the magnetisation direction of the storage layer from a configuration parallel to the magnetisation direction of the reference layer to a configuration antiparallel to the magnetisation direction of the reference layer or switching from a configuration antiparallel to the magnetisation direction of the reference layer to a configuration parallel to the magnetisation direction of the reference layer as a function of an initial magnetisation direction of the storage layer, and a step of determining the intensity of the external magnetic field to be measured from the value of the minimum switching current or the value of the minimum switching voltage.

2. The method for measuring the intensity of an external magnetic field according to claim 1, wherein said at least one memory point is a magnetic tunnel junction with out-of-plane magnetisation.

3. The method for measuring the intensity of an external magnetic field according to claim 1, wherein the step of determining the intensity of the external magnetic field further comprises the substeps of:

calculating a difference between the minimum switching current value or the minimum switching voltage value and at least one reference switching current value or reference switching voltage value measured according to a same method under a reference external magnetic field, and calculating a magnetic field intensity value comprising multiplying the difference between the minimum switching current value or the minimum switching voltage value and the at least one reference switching current value or reference switching voltage value by a proportionality constant and adding the value obtained to a value of the reference field intensity.

4. The method for measuring the intensity of an external magnetic field according to claim 3, wherein the proportionality constant is determined by calculating a ratio of the difference between a calibration switching current value or calibration switching voltage value and a reference switching current value or reference switching voltage value to the difference between an intensity value of a calibration magnetic field and an intensity value of the reference magnetic field.

5. The method for measuring the intensity of an external magnetic field according to claim 1, wherein the step of successively applying a plurality of currents or voltages of different amplitudes until switching of the magnetisation direction of the storage layer takes place comprises the substeps of:

determining a first resistance of said at least one magnetic memory point, determining the first resistance comprising measuring a current or voltage across the magnetic memory point, comparing the first resistance obtained to a reference resistance value to identify a relative initial magnetisation direction of the storage layer with respect to the reference layer, applying to said at least one magnetic memory point a current or voltage pulse of a predefined amplitude and polarity promoting switching of the storage layer to an opposite direction to the relative initial magnetisation direction of the storage layer with respect to the reference layer, determining a second resistance of said at least one magnetic memory point, determining the second resistance comprising measuring a current or voltage across the magnetic memory point after applying a current or voltage pulse to the magnetic memory point, comparing the second resistance obtained to the reference resistance value to determine whether switching of the magnetisation direction of the storage layer has taken place, if switching of the magnetisation direction of the storage layer has taken place:
the minimum switching current or the minimum switching voltage is the current or voltage applied in the previous step of applying a current or voltage pulse to the magnetic memory point, if switching of the magnetisation direction of the storage layer has not taken place, the substeps of applying a current or voltage pulse to the magnetic memory point, determining a second resistance and comparing the second resistance to the first resistance are repeated with a current or voltage pulse of a modified amplitude different from the predefined amplitude until switching of the magnetisation direction of the storage layer takes place.

6. The method for measuring the intensity of an external magnetic field according to claim 5, wherein the predefined amplitude is a low amplitude and the modified amplitude is greater than the low amplitude.

7. The method for measuring the intensity of an external magnetic field according to claim 1, wherein the step of successively applying a plurality of currents or voltages of different amplitudes until switching of the magnetisation direction of the storage layer takes place comprises the substeps of:

applying a current or voltage ramp or periodic signal, of a polarity promoting switching of the storage layer to an opposite direction to the relative initial magnetisation direction of the storage layer with respect to the reference layer, until switching of the magnetisation direction of the storage layer is detected, determining the minimum switching current or minimum switching voltage amplitude as a function of the total application time of the current or voltage ramp to obtain the value of the minimum switching current or the minimum switching voltage.

8. The method for measuring the intensity of an external magnetic field according to claim 1, further comprising a further step of applying a pulse after detecting switching of the magnetisation direction of the storage layer, the pulse having a polarity promoting switching of the storage layer to the relative initial magnetisation direction of the storage layer with respect to the reference layer and having an amplitude greater than the amplitude of the minimum switching current or the minimum switching voltage.

9. The method for measuring the intensity of an external magnetic field according to claim 1, wherein a plurality of magnetic memory points are used, and the step of successively applying a plurality of currents or voltages of different amplitudes is performed in parallel for the magnetic memory points of the plurality of magnetic memory points.

10. The method for measuring the intensity of an external magnetic field according to claim 9, wherein the step of successively applying a plurality of currents or voltages of different amplitudes in parallel is performed simultaneously for each magnetic memory point of the plurality of magnetic memory points and wherein the minimum switching current value or the minimum switching voltage value of the magnetisation direction is the minimum switching current or minimum switching voltage value of the magnetisation direction of the storage layer of each magnetic memory point of the plurality of magnetic memory points.

11. A magnetic memory point configured to implement the method for measuring an external magnetic field according to claim 1, and comprising a controller configured to manage the measurement of the resistance of the magnetic memory point.

12. The magnetic memory point according to claim 11, further comprising a magnetic tunnel junction with out-of-plane magnetisation or perpendicular anisotropy.

13. The magnetic memory point according to claim 11, further comprising a pulse generator and wherein the controller is further configured to manage the pulse generator.

14. The magnetic memory point according to claim 11, wherein the magnetic memory point has lateral dimensions of less than 200 nm.

15. A method for determining the relative distance between a magnetic memory point according to claim 11 and a magnetic object generating a magnetic field between 1 mT and 500 mT, the method comprising:
- measuring a perpendicular component of a magnetic field according to the method for measuring an external magnetic field at a plurality of points in space to determine an amplitude and a direction of the magnetic field,
- calculating the relative distance between the storage layer of the magnetic memory point and the magnetic object from simulations of the magnetic field generated by the magnetic object.

* * * * *